US007956684B1

(12) United States Patent
Cripe

(10) Patent No.: US 7,956,684 B1
(45) Date of Patent: Jun. 7, 2011

(54) CLASS-G RADIO FREQUENCY POWER AMPLIFIER

(75) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 84 days.

(21) Appl. No.: 12/567,283

(22) Filed: Sep. 25, 2009

(51) Int. Cl.
  *H03F 3/217* (2006.01)

(52) U.S. Cl. .................................. 330/251; 330/207 A
(58) Field of Classification Search .................. 330/251, 330/207 A, 301, 302, 311
See application file for complete search history.

*Primary Examiner* — Robert Pascal
*Assistant Examiner* — Khiem D Nguyen
(74) *Attorney, Agent, or Firm* — Matthew J. Evans; Daniel M. Barbieri

(57) ABSTRACT

A linear Radio Frequency power amplifier with improved efficiency and bandwidth is provided using two power amplifier devices, operating in a Class-G mode of operation.

17 Claims, 2 Drawing Sheets

CLASS-G RADIO FREQUENCY POWER AMPLIFIER

TECHNICAL FIELD

The present disclosure generally relates to the field of Radio Frequency power amplifiers, and more particularly to a circuit for a modified Class-G Radio Frequency power amplifier.

BACKGROUND

Linear Radio Frequency (RF) power amplifiers are commonly utilized in radio transmitters, particularly radio transmitters utilizing amplitude modulation. Power losses in linear RF power amplifiers have been identified as significant contributors to the overall power loss of radio transmitters. Various amplifier designs have attempted to improve efficiency at the expense of increasing circuit complexity or poor operational bandwidth.

SUMMARY

A circuit includes, but is not limited to: a first and a second power amplifier transistor, the first and the second power amplifier transistor each having a gate, a drain, and a source, the source of the first power amplifier transistor coupled to the drain of the second power amplifier transistor, the source of the second power amplifier transistor coupled to ground; a diode, the diode having an anode and a cathode, the anode of the diode coupled to the source of the first power amplifier and the drain of the second power amplifier transistor, the cathode of the diode coupled to a first voltage source; a decoupling capacitor, the decoupling capacitor having a first and a second end, the first end coupled to the cathode of the diode and the first voltage source, and the second end coupled to ground; a Radio Frequency choke, the Radio Frequency choke having a first and a second end, the first end coupled to the drain of the first power amplifier transistor, the second end coupled to a second voltage source; an output network coupled to the first end of the radio frequency choke and the drain of the first power amplifier transistor; a first bias voltage source coupled to the gate of the first power amplifier transistor; a second bias voltage source coupled to the gate of the second power amplifier transistor; a Radio Frequency source for driving the amplifier, the Radio Frequency source coupled to the gate of the second power amplifier transistor via the second bias voltage source; and a transformer, the transformer having an input cathode and anode and an output cathode and anode, the input cathode coupled to the Radio Frequency source, the input anode coupled to ground, the output cathode coupled to the gate of the first power amplifier transistor via the first bias voltage source, and the output anode coupled to the source of the first power amplifier transistor, the drain of the second power amplifier transistor, and the anode of the diode.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Radio frequency (RF) power amplifiers capable of generating complex output waveforms are generally linear power amplifiers. Typically, Class-A, Class-B, or Class-AB power amplifier types are utilized in such applications. However, when generating waveforms with a high peak voltage to average voltage ratio, the efficiency of such power amplifier types is low.

Linear amplification with nonlinear components (LINC) power amplifier designs provide higher efficiency while generating complex output waveforms, but require complex drive signal processing circuitry. Envelope Envelope elimination and restoration (EER) provides higher efficiency, but requires a high bandwidth power modulator to create the envelope signal. Doherty, Cheirex, and Taylor power amplifier designs also provide high efficiency, but are limited to narrow band frequency operation.

Reference will now be made in detail to the subject matter disclosed, which is illustrated in the accompanying drawings.

Figure 1:
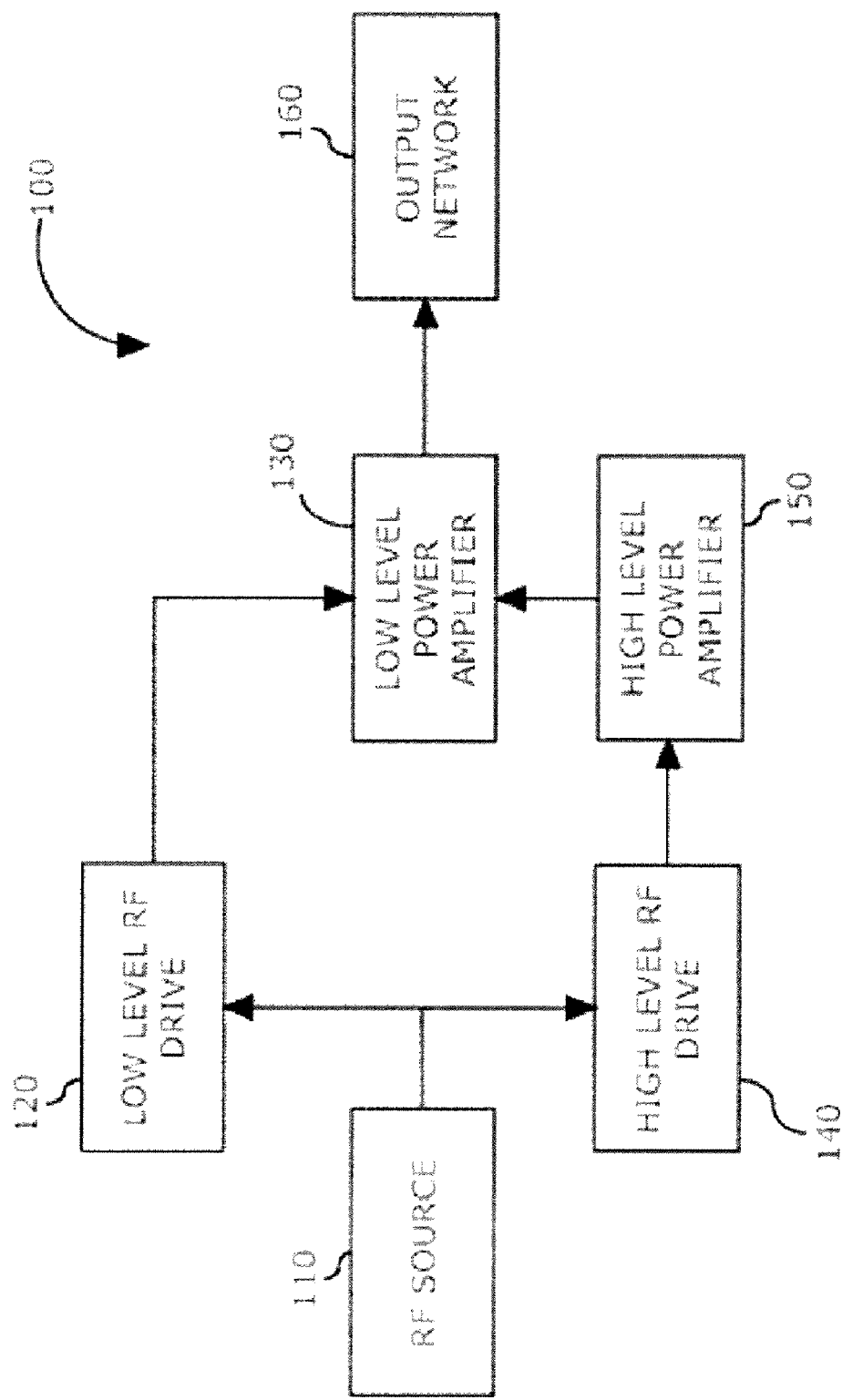
FIG. 1 is a simplified block diagram of a linear Radio Frequency power amplifier in accordance with an embodiment of the present disclosure.

Referring to FIG. 1, a simplified block diagram of an improved radio frequency (RF) signal power amplifier 100 in accordance with an exemplary embodiment of the present invention is shown. Power amplifier 100 may include RF source 110. RF source 110 may provide an RF signal to low level RF drive 120. Low level RF drive 120 may provide an input for the low level power amplifier 130 of power amplifier 100. Low level power amplifier 130 may be configured to amplify the RF signal for the entire output voltage range of power amplifier 100.

In further embodiments of the current disclosure, RF source 110 may also provide an RF signal to high level RF drive 140. High level RF drive 140 may provide an input for the high level power amplifier 150 of power amplifier 100. High level power amplifier 150 may be configured to amplify the RF signal for only a higher portion of the output voltage range of power amplifier 100. The output of high level power amplifier 150 may pass through low level power amplifier 130, adding to the output of low level power amplifier 130. Low level power amplifier 130 may then provide the amplified signal to an output network 160 of power amplifier 100. Low level power amplifier 130 may be connected to a higher voltage source than high level power amplifier 150.

Figure 2:
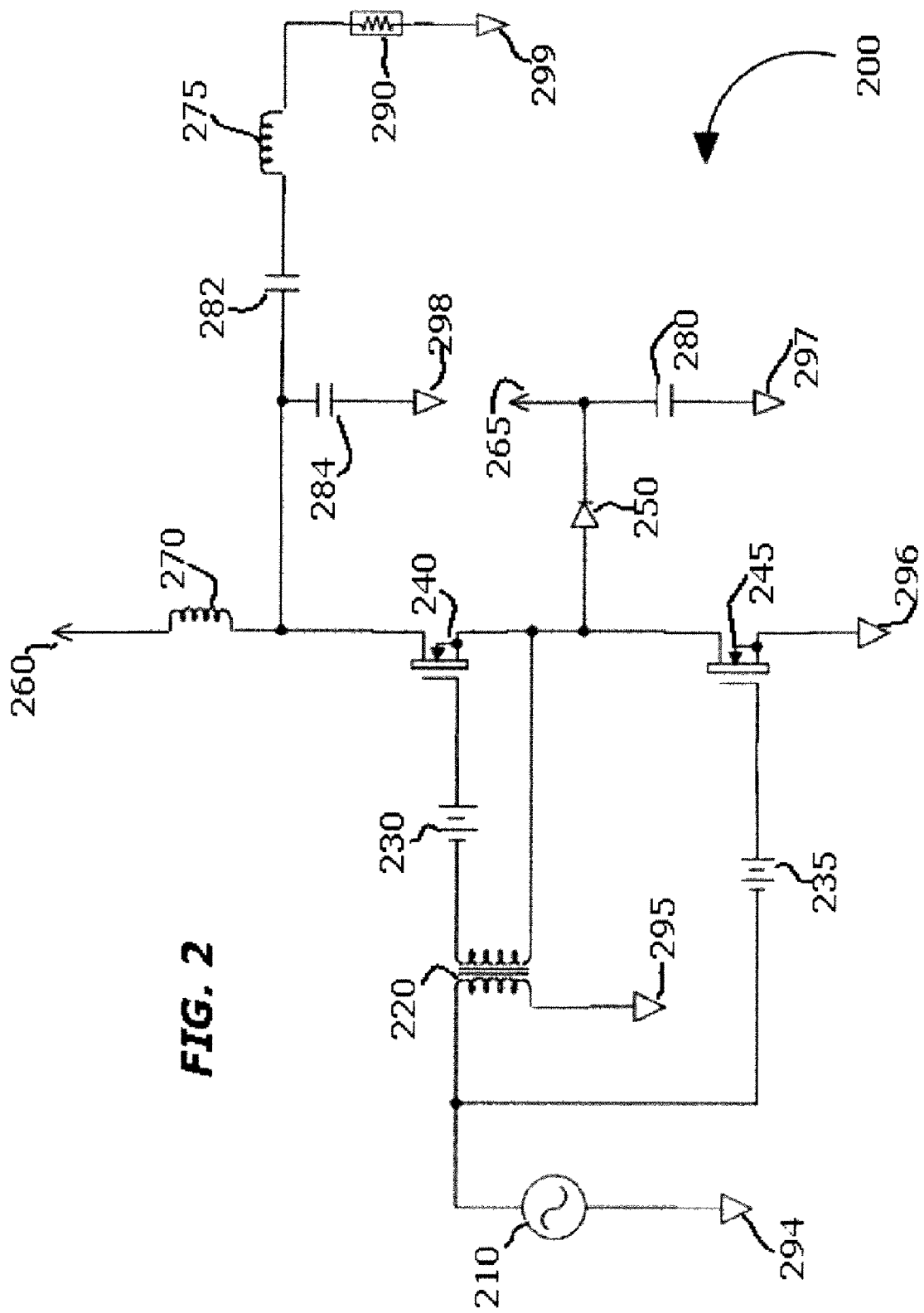
FIG. 2 is a circuit diagram of a linear Radio Frequency power amplifier circuit in accordance with an embodiment of the present disclosure.

Referring to FIG. 2, a circuit for amplifying a RF signal in accordance with an exemplary embodiment of the present invention is shown. For example, the circuit may be utilized as a single-ended amplifier. Further, the circuit may be utilized as a push-pull amplifier.

In a current embodiment of the present disclosure, circuit 200 may include first power amplifier transistor 240 and second power amplifier transistor 245. The source of first power amplifier transistor 240 may be connected to the drain of second power amplifier transistor 245. Further, the source of second power amplifier transistor 245 may be connected to common connection 296. First power amplifier transistor 240 and second power amplifier transistor 245 may be n-type power amplifier transistors. In another embodiment, first power amplifier transistor 240 and second power amplifier transistor 245 may be MOSFET-type transistors or HEMT-type transistors. The selection of technology for first power amplifier transistor 240 and second power amplifier transistor 245 may be related to the frequency of RF voltage source 210. RF voltage source 210 may be the RF source 110.

In further embodiments of the present disclosure, circuit 200 may include diode 250. Diode 250 may be a low-capacitance diode. For example, diode 250 may be a Schottky diode. The anode of diode 250 may be connected to the source of first power amplifier 240 and the drain of second power amplifier transistor 245. The cathode of diode 250 may be connected to first voltage source 265 and to a first end of decoupling capacitor 280. A second end of decoupling capacitor 280 may be connected to common connection 297. Decoupling capacitor 280 may be selected to provide RF decoupling of first voltage source 265. However, other decoupling means may be selected to provide RF decoupling of first voltage source 265. First voltage source 265 may be a voltage rail.

In further embodiments of the present disclosure, circuit 200 may include RF choke 270. RF choke 270 may be an inductor. A first end of RF choke 270 may be connected to the drain of first power amplifier transistor 240. A second end of RF choke 270 may be connected to second voltage source 260. RF choke 270 may be selected to provide RF decoupling of second voltage source 260. However, other decoupling means may be selected to provide RF decoupling of second voltage source 260. Second voltage source 260 may be a voltage rail. Second voltage source 260 may be selected so the voltage of second voltage source 260 is higher than the voltage of first voltage source 265. The voltage of second voltage source 260 may be a multiple of the voltage of first voltage source 265. For example, the voltage of second voltage source 260 may be 24 Volts and the voltage of first voltage source 265 may be 12 Volts, resulting in a nominal 2:1 ratio for second voltage source 260 and first voltage source 265. In another example, the voltage of second voltage source 260 may be at least twice the voltage of first voltage source 265.

In a further embodiment of the present disclosure, the voltages of first voltage source 265 and second voltage source 260 may be varied dynamically to provide envelope tracking to optimize the efficiency of both first power amplifier 240 and second power amplifier 245. For example, second voltage source 260 may be varied according to the peak voltage requirement required to reproduce the original RF signal without distortion. Further, second voltage source 260 may be varied so the voltage difference between second voltage source 260 and first voltage source 265 is related to the root mean square (RMS) voltage of the RF signal.

In a further embodiment of the present disclosure, varying second voltage source 260 and/or first voltage source 265 may result in minimum overall circuit dissipation. Further, varying second voltage source 260 and/or first voltage source 265 may result in evenly dividing circuit dissipation between first power transistor 240 and second power transistor 245.

In further embodiments of the present disclosure, circuit 200 may include an output network 160. Output network 160 may be connected to the first end of RF choke 270 and the drain of first power amplifier 240. Output network 160 may include first capacitor 284. A first end of first capacitor 284 may be connected to the drain of first power amplifier transistor 240 and the first end of RF choke 270. A second end of first capacitor 284 may be connected to common connection 298. Output network 160 may include second capacitor 282. A first end of second capacitor 282 may be connected to the drain of first power amplifier transistor 240, the first end of RF choke 270, and the first end of first capacitor 284. Output network 160 may include inductor 275. A first end of inductor 275 may be connected to the second end of second capacitor 282. A second end of inductor 275 may be connected to a RF load 290 of circuit 200. RF load 290 may also be part of output network 160. The RF load 290 may then lead to a common connection 299. The values of the inductor 275, first capacitor 284, and second capacitor 282 of output network 160 may be set for a generic Class-B power amplifier.

In further embodiments of the present disclosure, circuit 200 may include first bias voltage source 230. First bias voltage source 230 may be connected to the gate of first power amplifier transistor 240. First bias voltage source 230 may be set to maintain first power amplifier transistor 240 on the conduction threshold. First bias voltage source 230 may be variable.

In further embodiments of the present disclosure, circuit 200 may include second bias voltage source 235. Second bias voltage source 235 may be connected to the gate of second power amplifier transistor 245. Second bias voltage source 235 may be set to maintain second power amplifier transistor 245 on the conduction threshold. Second bias voltage source 235 may account for the peak of a RF voltage source also connected to the gate of second power amplifier transistor 245 when set to maintain second power amplifier transistor 245 on the conduction threshold. Second bias voltage source 235 may be variable.

In further embodiments of the present disclosure, circuit 200 may be connected to an RF voltage source 210, which is connected to common connection 294. Circuit 200 may amplify the RF voltage source 210. The RF voltage source 210 may be coupled to the gate of second power amplifier transistor 245 via second bias voltage source 235. The sum of the voltages of RF voltage source 210 and second bias voltage source 235 may drive second power amplifier transistor 245. Second bias voltage source 235 may be included in high level RF drive 140.

In further embodiments of the present disclosure, circuit 200 may include transformer 220. The input cathode of transformer 220 may be connected to the RF voltage source. The input anode of transformer 220 may be connected to common connection 295. The output cathode of transformer 220 may be connected to gate of first power amplifier transistor 240 via first bias voltage source 230. The sum of the voltages of the output cathode of transformer 220 and first bias voltage source 230 may drive first power amplifier transistor 240. The output anode of transformer 220 may be connected to the source of first power amplifier transistor 240, the drain of second power amplifier transistor 245, and the anode of diode 250. Transformer 220 and first bias voltage source 230 may be included in low level RF drive 120. Common connections 294-299 may be connections to ground.

In operation, first power amplifier transistor 240 may act as a class-B power amplifier for low levels of drive. Source current for first power amplifier transistor 240 may flow through diode 250 to first voltage source 265 for low levels of drive. High levels of drive occur when the sum of the peak voltage of RF voltage source 210 and the voltage of the second bias voltage source 235 is greater than the conduction threshold of second power amplifier transistor 245. Second power amplifier transistor 245 will conduct beyond this point and add to the output of circuit 200, reverse biasing diode 250. Second bias voltage 235 may be variable to place second power amplifier transistor 245 at its conduction threshold as first power amplifier transistor enters compression. The efficiency of circuit 200 may equal a conventional Class-B power amplifier at full output and at −6 dBc. Circuit 200 may provide high efficiency amplification of broadband signals with low circuit complexity.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A class G power amplifier, comprising:
a first and a second power amplifier transistor, the first and the second power amplifier transistor each having a gate, a drain, and a source, the source of the first power amplifier transistor coupled to the drain of the second power amplifier transistor, the source of the second power amplifier transistor coupled to ground;
a diode, the diode having an anode and a cathode, the anode of the diode coupled to the source of the first power amplifier and the drain of the second power amplifier transistor, the cathode of the diode coupled to a first voltage source;
a decoupling capacitor, the decoupling capacitor having a first and a second end, the first end coupled to the cathode of the diode and the first voltage source, and the second end coupled to ground;
a radio frequency choke, the radio frequency choke having a first and a second end, the first end coupled to the drain of the first power amplifier transistor, the second end coupled to a second voltage source;
an output network coupled to the first end of the radio frequency choke and the drain of the first power amplifier transistor;
a first bias voltage source coupled to the gate of the first power amplifier transistor;
a second bias voltage source coupled to the gate of the second power amplifier transistor;
a radio frequency source for driving the amplifier, the radio frequency source coupled to the gate of the second power amplifier transistor via the second bias voltage source; and
a transformer, the transformer having an input cathode and anode and an output cathode and anode, the input cathode coupled to the radio frequency source, the input anode coupled to ground, the output cathode coupled to the gate of the first power amplifier transistor via the first bias voltage source, and the output anode coupled to the source of the first power amplifier transistor, the drain of the second power amplifier transistor, and the anode of the diode.

2. The amplifier of claim 1, wherein the first and second power amplifier transistors are MOSFET-type power amplifier transistors.

3. The amplifier of claim 1, wherein the first and second power amplifier transistors are HEMT-type power amplifier transistors.

4. The amplifier of claim 1, wherein the diode is a low-capacitance Schottky diode.

5. The amplifier of claim 1, wherein the second voltage source has a higher voltage than the first voltage source.

6. The amplifier of claim 5, wherein a voltage of the second voltage source is at least twice a voltage of the first voltage source.

7. The amplifier of claim 1, wherein the output network further includes: a first capacitor, the first capacitor having a first end and a second end, the first end of the first capacitor coupled to the drain of the first power amplifier transistor and the first end of the radio frequency choke, the second end of the first capacitor coupled to ground, an inductor, the inductor having a first end and a second end, the first end of the inductor coupled to a second end of a second capacitor, the second end of the inductor coupled to a radio frequency load of the amplifier.

8. The amplifier of claim 7, wherein the output network further includes: the second capacitor, the second capacitor having a first end and a second end, the first end of the second capacitor coupled to the drain of the first power amplifier transistor, the first end of the radio frequency choke, and the first end of the first capacitor.

9. The amplifier of claim 8, wherein the output network further includes: the inductor, the inductor having a first end and a second end, the first end of the inductor coupled to the second end of the second capacitor.

10. The amplifier of claim 9, wherein the output network further includes: the radio frequency load of the amplifier coupled to the second end of the inductor.

11. The amplifier of claim 10, wherein the output network further includes:
wherein values for at least one of: the first capacitor, the second capacitor, or the inductor are tuned for a generic Class-B power amplifier.

12. The amplifier of claim 1, wherein the first bias voltage source is variable to maintain the first power amplifier transistor on the threshold of conduction.

13. The amplifier of claim 1, wherein the second bias voltage source is variable, wherein a sum of the peak radio frequency source voltage and the second bias voltage source maintains the second power amplifier transistor on the threshold of conduction.

14. The amplifier of claim 10, wherein a sum of the peak radio frequency source voltage and the second bias voltage source maintains the second power amplifier transistor on the threshold of conduction as the first power amplifier transistor enters compression.

15. The amplifier of claim 1, wherein the first power amplifier transistor operates over an entire voltage range of the amplifier.

16. The amplifier of claim 1, wherein the second power amplifier transistor operates over a partial voltage range of the amplifier.

17. The amplifier of claim 1, wherein the amplifier will operate at an efficiency equal to a Class-B power amplifier at full output and at −6 dBc.

* * * * *